(12) United States Patent
Chen

(10) Patent No.: US 11,313,519 B2
(45) Date of Patent: Apr. 26, 2022

(54) LIGHT SOURCE MODULE

(71) Applicant: EOSOPTO TECHNOLOGY CO., LTD, Taichung (TW)

(72) Inventor: Koyu Chen, Taichung (TW)

(73) Assignee: EOSOPTO TECHNOLOGY CO., LTD, Taichung (TW)

( * ) Notice: Subject to any disclaimer, the term of this patent is extended or adjusted under 35 U.S.C. 154(b) by 0 days.

(21) Appl. No.: 17/170,816

(22) Filed: Feb. 8, 2021

(65) Prior Publication Data

US 2021/0404610 A1 Dec. 30, 2021

Related U.S. Application Data

(60) Provisional application No. 63/046,661, filed on Jun. 30, 2020.

(30) Foreign Application Priority Data

Sep. 15, 2020 (TW) ................................ 109131624

(51) Int. Cl.
*F21K 9/68* (2016.01)
*H01L 33/60* (2010.01)

(52) U.S. Cl.
CPC ................ *F21K 9/68* (2016.08); *H01L 33/60* (2013.01)

(58) Field of Classification Search
CPC .................................... F21K 9/68; H01L 33/60
See application file for complete search history.

(56) References Cited

U.S. PATENT DOCUMENTS

| | | | |
|---|---|---|---|
| 9,385,287 | B2 | 7/2016 | Chen et al. |
| 2012/0299017 | A1 | 11/2012 | Chen et al. |
| 2017/0194540 | A1 | 7/2017 | Liu et al. |
| 2018/0138375 | A1 | 5/2018 | Park et al. |

FOREIGN PATENT DOCUMENTS

| | | |
|---|---|---|
| TW | 200818551 | 4/2008 |
| TW | 201246628 | 11/2012 |
| TW | 201605074 | 2/2016 |

(Continued)

OTHER PUBLICATIONS

"Office Action of Taiwan Counterpart Application", dated May 14, 2021, p. 1-p. 9.

(Continued)

*Primary Examiner* — Vip Patel
(74) *Attorney, Agent, or Firm* — JCIPRNET

(57) ABSTRACT

A light source module includes a substrate, a light emitting device, a package structure, and an optical pattern. The light emitting device and the package structure are disposed on a surface of the substrate, and the package structure covers the light emitting device. The package structure has a first groove and a second groove connected to each other. The light emitting device is located between the first grove and the substrate. The second groove is located between the first groove and the substrate. An orthogonal projection of the region occupied by the first groove on the substrate has a geometric center. The light emitting device is located at the geometric center. An orthogonal projection of the region occupied by the second groove on the substrate does not overlap the geometric center. The optical pattern is disposed in the first groove and the second groove, and is transflective.

14 Claims, 7 Drawing Sheets

(56) References Cited

FOREIGN PATENT DOCUMENTS

| TW | 201724566 | 7/2017 |
| TW | 201929270 | 7/2019 |
| TW | 201930984 | 8/2019 |
| TW | I671574 | 9/2019 |
| TW | 201944146 | 11/2019 |

OTHER PUBLICATIONS

"Search Report of Europe Counterpart Application", dated Feb. 11, 2022, pp. 1-10.

LIGHT SOURCE MODULE

CROSS-REFERENCE TO RELATED APPLICATION

This application claims the priority benefit of U.S. provisional application Ser. No. 63/046,661, filed on Jun. 30, 2020, and Taiwan application serial no. 109131624, filed on Sep. 15, 2020. The entirety of each of the above-mentioned patent applications is hereby incorporated by reference herein and made a part of this specification.

BACKGROUND

Technical Field

The disclosure relates to a backlight module, and particularly relates to a light source module having an asymmetric package structure.

Description of Related Art

As non-self-illuminating displays such as LED displays are applied more and more widely, the design of backlight modules also needs to be adjusted to cope with the various applications. To satisfy the demands for a high dynamic range (HDR) and a high contrast in display panel products, the backlight modules need to be capable of local dimming. Therefore, products adopting direct type backlight modules as the main light source framework have gradually become the mainstream on the market. Since such backlight module is expected to be thinner (e.g., an optical distance less than 10 millimeters), a light emitting device is usually covered by a package layer having a reflective member or a reflective structure, so that light may be output uniformly when being emitted through the light output surface of the backlight module.

However, when being transmitted within the package layer, some light beams emitted by the light emitting device still undergo multiple total reflections and are transmitted laterally (e.g., in a direction perpendicular to the light output direction) to an adjacent or even remote light source (i.e., another light emitting device). As a result, a halo effect is generated on the periphery of the light output region of the light emitting device, which blurs the periphery of the displayed image and thus deteriorates the overall display quality (e.g., display contrast). Meanwhile, when provided with the reflective member or the reflective structure, a reflective dark spot tends to be generated in a region in which the light output surface of the backlight module is overlapped with the light emitting device, and the overall light output uniformity may be affected. Therefore, how to facilitate the light output uniformity of an ultra-thin direct type backlight module has become an issue to work on.

SUMMARY

The disclosure provides a light source module capable of effectively increasing the total light output and the light output uniformity of a specific light output region.

A light source module according to an embodiment of the disclosure includes a substrate, a light emitting device, a package structure, and an optical pattern. The light emitting device and the package structure are disposed on a surface of the substrate, and the package structure covers the light emitting device. The package structure has a first groove and a second groove connected to each other. The light emitting device is located between the first grove and the substrate. The second groove is located between the first groove and the substrate. An orthogonal projection of the region occupied by the first groove on the substrate has a geometric center. The light emitting device is located at the geometric center. An orthogonal projection of the region occupied by the second groove on the substrate does not overlap the geometric center. The optical pattern is disposed in the first groove and the second groove, and is transflective.

According to an embodiment of the disclosure, in the light source module, an orthogonal projection of the package structure on the substrate has a symmetric axis. The symmetric axis passes through the geometric center, and the second groove and the light emitting device are arranged along an axial direction of the symmetric axis.

According to an embodiment of the disclosure, in the light source module, the package structure is further provided with a first edge and a second edge opposite to each other. A first distance is provided between the first edge and the geometric center, a second distance is provided between the second edge and the geometric center, and the first distance is shorter than the second distance.

According to an embodiment of the disclosure, in the light source module, a ratio of the first distance to the second distance is less than 0.8.

According to an embodiment of the disclosure, in the light source module, the package structure further has a ridge defining the first groove. A distance D is provided between the ridge and the geometric center in the axial direction of the symmetric axis. The region occupied by the second groove has a width W in the axial direction of the symmetric axis, and W<D is satisfied.

According to an embodiment of the disclosure, in the light source module, the light emitting device has a device length L in the axial direction of the symmetric axis. The package structure further has a groove bottom surface defining the second groove. The groove bottom surface has a width W in the axial direction of the symmetric axis, and W'<D−(L/2) is satisfied.

According to an embodiment of the disclosure, in the light source module, the package structure and the light emitting device respectively have a maximum thickness T and a device thickness t in a normal direction of the surface of the substrate. An included angle θ is provided between a virtual connection line, as a shortest interval between the ridge and the light emitting device, and the normal direction of the surface of the substrate, and D=L/2+(T−t)·tan θ is satisfied.

According to an embodiment of the disclosure, in the light source module, the package structure further has a groove bottom surface defining the first groove. The light emitting device has a top surface facing the first groove. A distance between the groove bottom surface of the package structure and the top surface of the light emitting device is greater than zero.

According to an embodiment of the disclosure, in the light source module, the package structure further has a ridge surrounding the first groove and the second groove and a groove bottom surface defining the second groove. A distance between the ridge and the surface of the substrate defines a maximum thickness of the package structure in a direction perpendicular to the substrate. A distance is provided between the groove bottom surface and the ridge in the direction perpendicular to the substrate, and the distance is shorter than the maximum thickness of the package structure.

According to an embodiment of the disclosure, in the light source module, the optical pattern includes a first portion and a second portion. The second portion is disposed between the first portion and the substrate. The first portion has a plurality of reflective particles, and the second portion has a plurality of wavelength conversion particles.

According to an embodiment of the disclosure, in the light source module, the package structure further has a ridge surrounding the first groove and the second groove and a groove bottom surface defining the second groove. The first portion of the optical pattern contacts the groove bottom surface. A distance d is provided between the groove bottom surface and the ridge in a direction perpendicular to the substrate. The second portion has a thickness t' in the direction perpendicular to the substrate, and t'<2d/3 is satisfied.

According to an embodiment of the disclosure, in the light source module, a transmittance of the optical pattern ranges between 10% and 50%.

According to an embodiment of the disclosure, in the light source module, the optical pattern includes a transmissive base material and a plurality of reflective particles. The reflective particles are dispersedly distributed in the transmissive base material.

According to an embodiment of the disclosure, in the light source module, a material of the reflective particles includes silicon dioxide, titanium dioxide, a metal material, or a combination thereof.

Based on the above, in the light source module according to an embodiment of the disclosure, the light emitting device is disposed to be overlapped with the geometric center of the first groove of the package structure, and the optical pattern is filled into the first groove. With the optical pattern being transflective, the forward light output of the light emitting device may be adjusted, and the dark spot phenomenon which occurs after some of the light beams are reflected by the optical pattern may be alleviated. Meanwhile, the second groove connected with the first groove is disposed on a side of the light emitting device, and the optical pattern further extends into the second groove. Accordingly, the majority of the light beams may be deflected to a region of the light emitting device on a side opposite to the second groove. Thus, the light output of a specific region may be effectively increased, while the light beams may be prevented from being transmitted to the light output region of the adjacent light emitting device.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
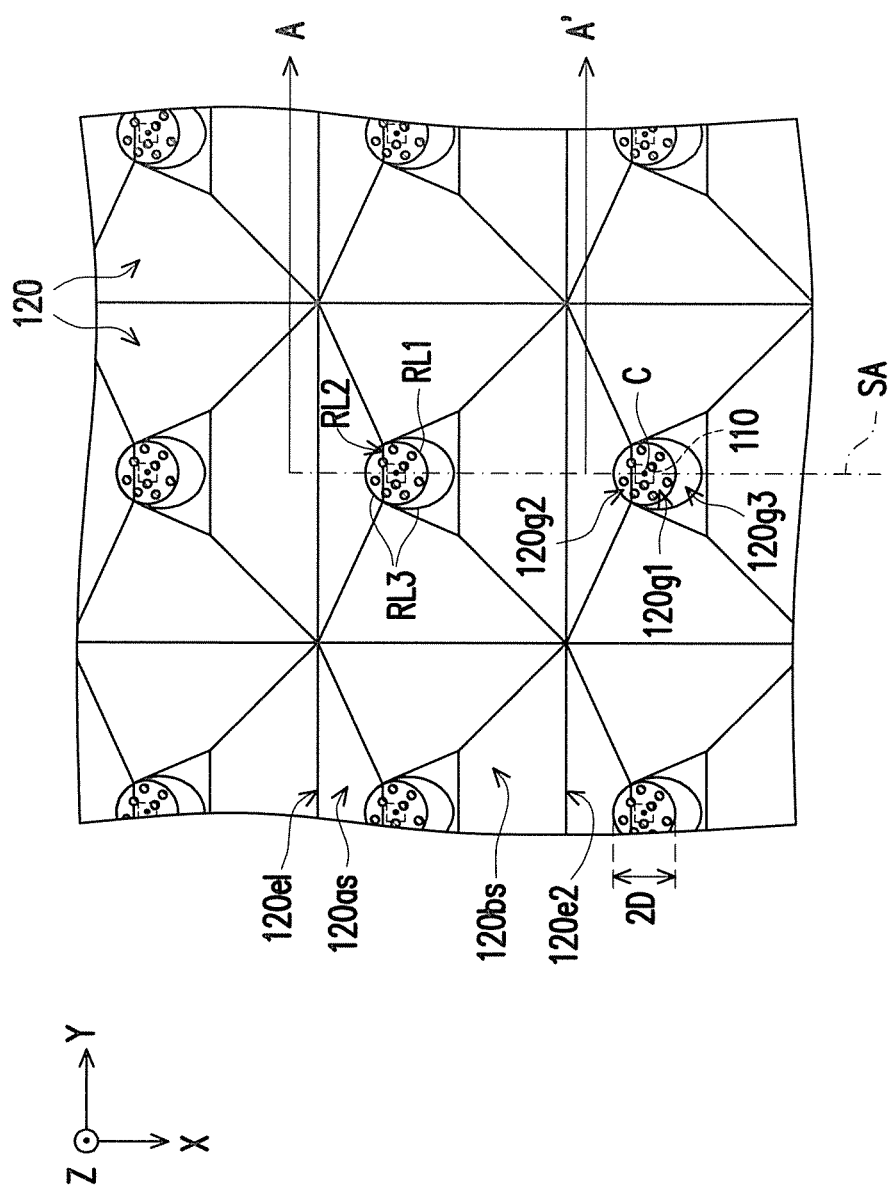
FIG. 1A is a schematic top view illustrating a light source module according to a first embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

It is to be understood that both the foregoing and other detailed descriptions, features and advantages are intended to be described more comprehensively by providing an embodiment accompanied with figures hereinafter. The language used to describe the directions such as up, down, left, right, front, back or the like in the reference drawings is regarded in an illustrative rather than in a restrictive sense. Thus, the language used to describe the directions is not intended to limit the scope of the disclosure.

Figure 1B:
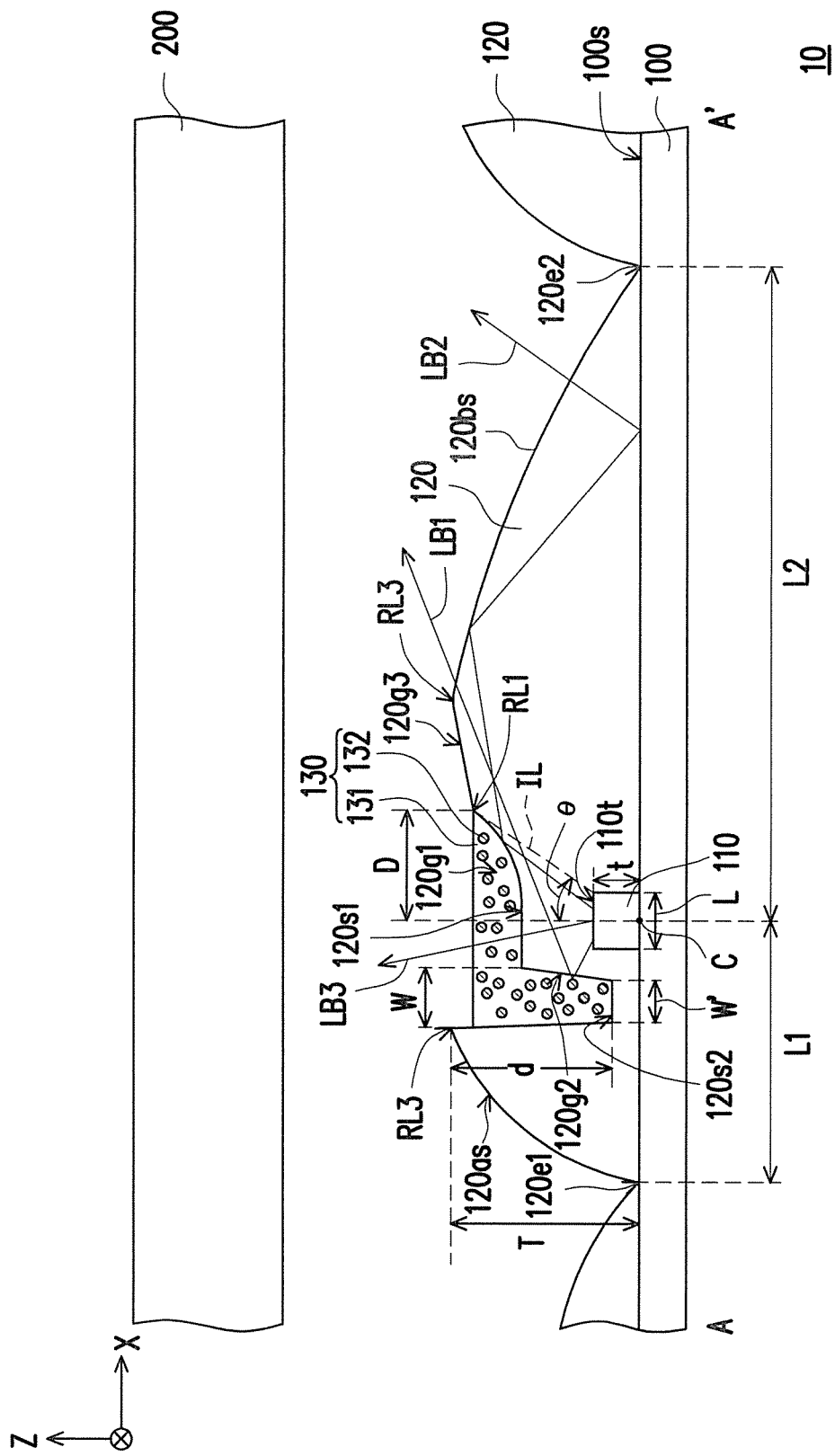
FIG. 1B is a schematic cross-sectional view of the light source module of FIG. 1.
Figure 2:
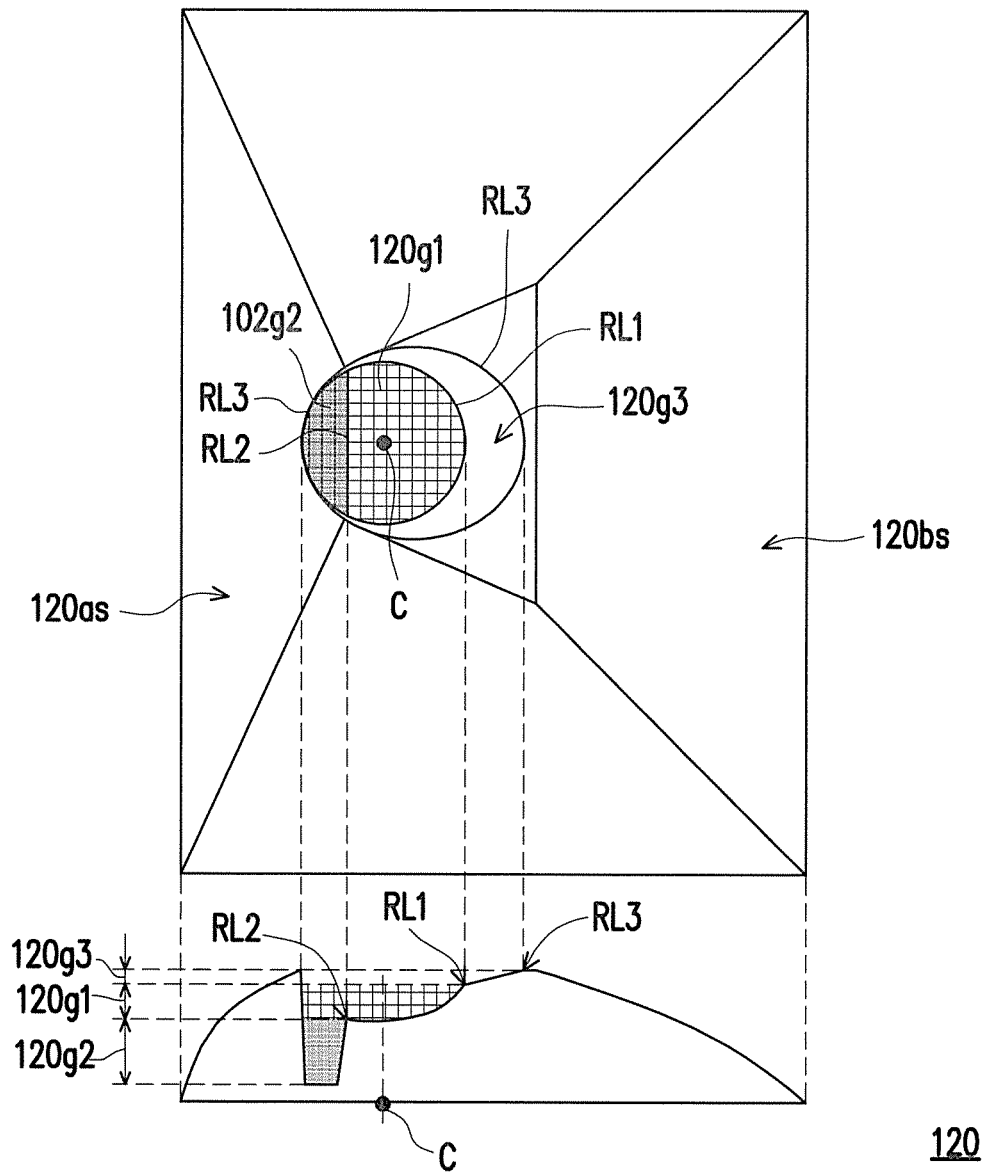
FIG. 2 is a schematic top view and cross-sectional view of a package structure of FIG. 1.
Figure 3A:
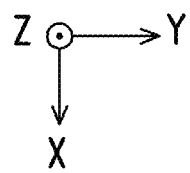
FIG. 3A is a diagram illustrating an illuminance distribution when the light source module of FIG. 1A is not provided with an optical film.
Figure 3A:
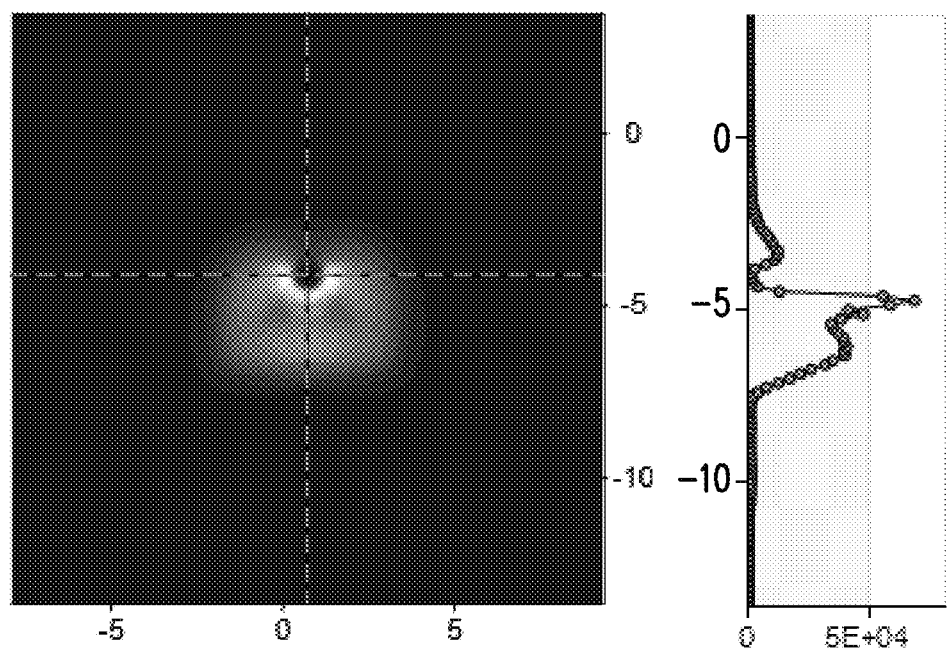
Figure 3A:
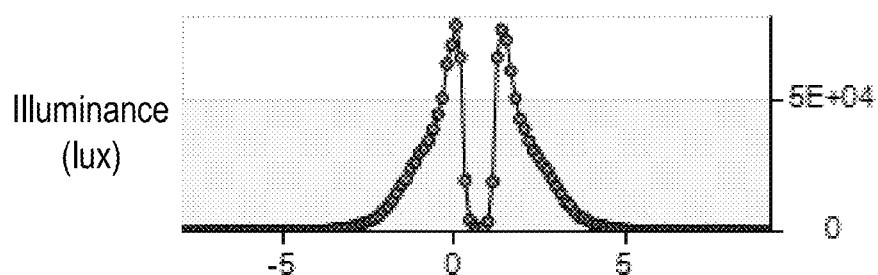
Figure 3B:
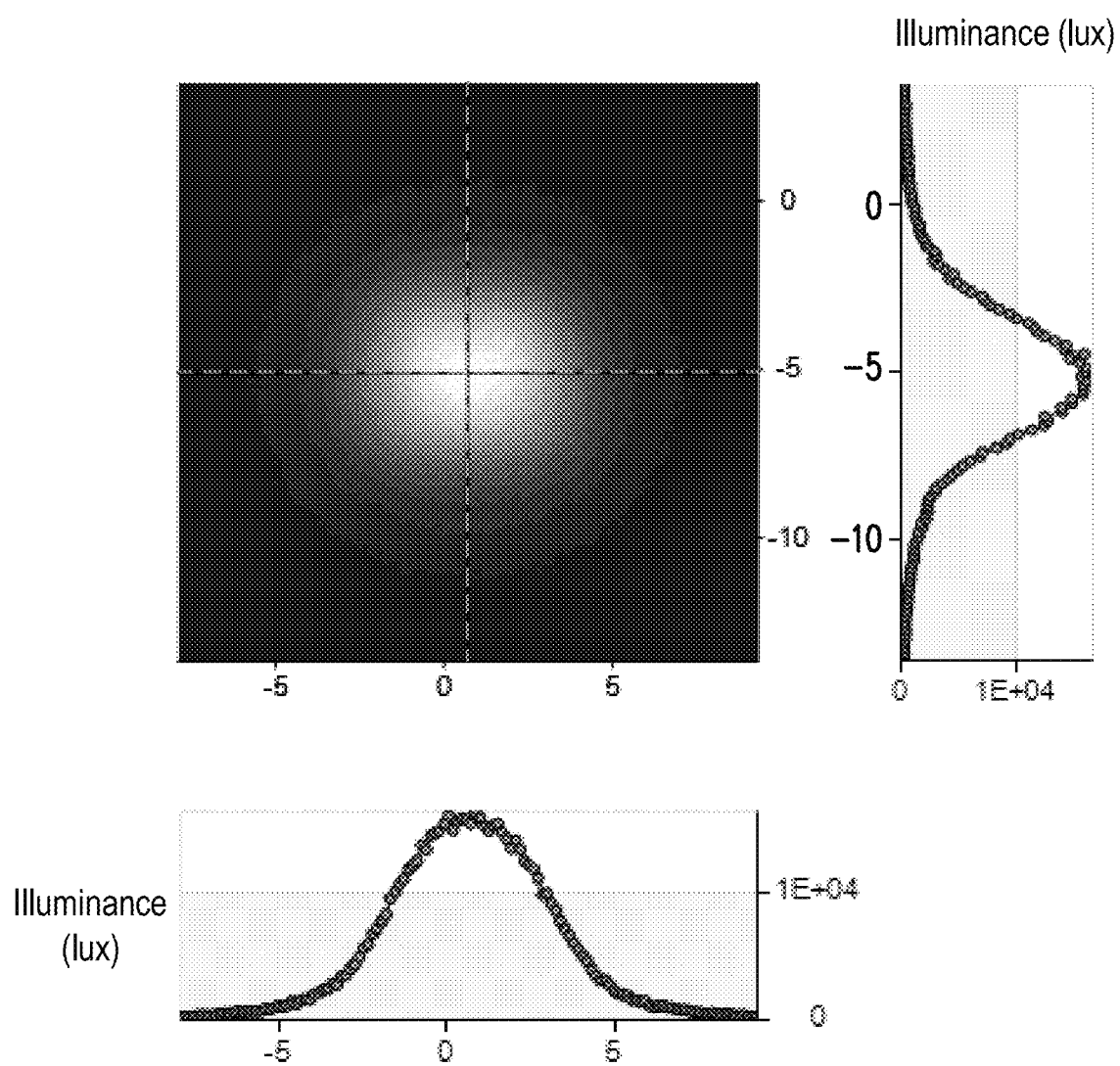
FIG. 3B is a diagram illustrating an illuminance distribution when the light source module of FIG. 1A is provided with an optical film.

FIG. 1A is a schematic top view illustrating a light source module according to a first embodiment of the disclosure. FIG. 1B is a schematic cross-sectional view of the light source module of FIG. 1A. FIG. 2 is a schematic top view and cross-sectional view of a package structure of FIG. 1A. FIG. 3A is a diagram illustrating an illuminance distribution when the light source module of FIG. 1A is not provided with an optical film. FIG. 3B is a diagram illustrating an illuminance distribution when the light source module of FIG. 1A is provided with an optical film. It is noted that FIG. 1B corresponds to a cross-sectional line A-A' of FIG. 1A. For the clarity of illustration, an optical film 200 shown in FIG. 1B is omitted in FIG. 1A, and the reflective particles 132 show in FIG. 1A and FIG. 1B is omitted in FIG. 2.

Referring to FIGS. 1A, 1B and 2, the light source module 10 includes a substrate 100, a plurality of light emitting devices 110, and a plurality of package structures 120. The light emitting devices 110 and the package structures 120 are disposed on a surface 100s of the substrate 100. In addition, the package structures 120 respectively cover the light emitting devices 110. For example, the light emitting devices 110 may be arranged into an array on the substrate 100, such as being arranged into a plurality of columns and rows in X and Y directions. In addition, the package structures 120 overlapped with the light emitting devices 110 are arranged to be connected with each other. The material of the package structure 120 includes a plastic material, a resin material (e.g., acrylic resin), or other suitable transparent package materials.

It should be noted that the contents shown in FIG. 1A merely serve for an illustrative purpose. The disclosure is not particularly limited by the arrangements of the light emitting devices 110 and the package structures 120. In other embodiments, the light emitting devices 110 and the package structures 120 may also be arranged based on the actual optical design or needs. For example, two adjacent package structures 120 may be disposed separately from each other on the substrate 100. Meanwhile, in the embodiment, an example in which each package structure 120 covers one light emitting device is described for an illustrative purpose. However, the disclosure is not limited thereto. In other embodiments, each package structure 120 may cover two or more light emitting devices 110, such as three light emitting devices respectively emitting red light, green light, and blue light.

In the embodiment, the light emitting device 110 may be a light emitting diode (LED), such as a mini LED or a micro LED. It should be noted that the orthogonal projection of the package structure 120 on the surface 100s of the substrate 100 has an outer profile that is substantially rectangular. However, the disclosure is not limited thereto. In other embodiments, the outer profile of the orthogonal projection of the package structure on the substrate 100 may also be arc-shaped, polygonal, or in other suitable shapes. Meanwhile, in the embodiment, the orthogonal projection of the package structure 120 on the surface 100s of the substrate 100 has an symmetric axis SA. In other words, the two portions of the package structure 120 on the two sides with respect to the symmetric axis SA are in mirror symmetry.

In order to deflect most of the light beams from the light emitting device 110 to a region on a side of the light emitting device 110, the package structure 120 exhibits an asymmetric structural distribution in a specific direction. For example, the package structure 120 of the embodiment has an asymmetric groove disposed to be overlapped with the light emitting device 110. In addition, the asymmetric groove exhibits asymmetry in the axial direction (e.g., X direction) of the symmetric axis SA.

Specifically, the asymmetric groove may be formed by a first groove 120g1 and a second groove g2 connected to each other. The second groove 120g2 is located between the first groove 120g1 and the substrate 100. In the embodiment, the orthogonal projection of the region occupied by the first groove 120g1 on the substrate 100 has a geometric center C. The symmetric axis SA of the package structure 120 passes through the geometric center C, and the orthogonal projection of the region occupied by the second groove 120g2 on the substrate 100 is not overlapped with the geometric center C.

More specifically, the orthogonal projection of the region occupied by the second groove 120g2 on the substrate 100 is overlapped with the symmetric axis SA and is located between the geometric center C and a first edge 120e1. In addition, the package structure 120 is also provided with the first edge 120e1 and a second edge 120e2 opposite to each other in the axial direction of the symmetric axis SA. A distance L1 is provided between the first edge 120e1 and the geometric center C, and a second distance L2 is provided between the second edge 120e2 and the geometric center C. In addition, the first distance L1 is shorter than the second distance L2. In other words, the asymmetric groove is provided in the package structure 120 at a position close to the first edge 120e1. For example, in the embodiment, a ratio of the first distance L1 to the second distance L2 may be less than 0.8. Accordingly, the package structure 120 may exhibit favorable asymmetry in the axial direction of the symmetric axis SA.

In the embodiment, the light emitting device 110 may be optionally disposed on the substrate 100 at a position overlapped with the geometric center C. In other words, the second groove 120g2 and the light emitting device 110 are arranged along the axial direction of the symmetric axis SA of the package structure 120. In order to deflect most of the light beams from the light emitting device 110 to a region on a specific side of the light emitting device 110 (such as the right-side region of the light emitting device 110 shown in FIG. 1B), the light source module 10 further includes an optical pattern 130 filled into the first groove 120g1 and the second groove 120g2. In addition, the optical pattern 130 is transflective. For example, the optical pattern 130 may include a transmissive base material 131 and a plurality of reflective particles 132 dispersedly distributed in the transmissive base material 131. The material of the transmissive base material 131 includes, for example, acrylic resin, epoxy resin, hexamethyldisiloxane (HMDSO), or other suitable polymer materials. The material of the reflective particle 132 includes silicon dioxide (SiO2), titanium dioxide (TiO2), a metal material, or a combination thereof, or other materials with a suitable reflectivity.

By modulating the doping concentration of the reflective particles 132, the transmittance of the optical pattern 130 may be adjusted between 10% and 50% (or the concentration of the reflective particles 132 of the optical pattern 130 between 20% and 60%), so as to satisfy the needs of different optical designs (e.g., having different asymmetric output light shapes). For example, a light beam LB1 transmitted from the light emitting device 110 toward the second groove 120g2 is transmitted toward a side (e.g., the right side in FIG. 1B) of the light emitting device 110 away from the second groove 120g2 after being reflected by the reflective particles 132. Similarly, a light beam (not shown) transmitted from the light emitting device 110 toward the first groove 120g1 may be transmitted toward the substrate 100 after being reflected by the reflective particles 132 in the first groove 120g1. Since the substrate 100 of the embodiment is a reflective substrate, the light beam reflected by the reflective particles 132 in the first groove 120g1 may be further transmitted laterally within the package structure 120 through the reflection of the substrate 100. However, the disclosure is not limited thereto.

More specifically, the package structure 120 is further provided with a ridge RL1 defining the first groove 120g1. An included angle θ is provided between a virtual connection line IL, as a shortest interval between the ridge RL1 and the light emitting device 110, and the normal direction of the surface 100s of the substrate 100, and an arrangement relationship between the package structure 120 and the light emitting device 110 satisfies: D=L/2+(T−t)·tan θ, wherein D represents a distance between the ridge RL1 and the geometric center C in the axial direction (e.g., X direction) of the symmetric axis SA, L represents a device length of the light emitting device 110 in the axial direction of the symmetric axis SA, t represents a device thickness of the light emitting device 110 in the normal direction of the surface 100s of the substrate 100, and T represents a maximum thickness of the package structure 120 in the normal direction of the surface 100s of the substrate 100.

The included angle θ is determined according to a ratio between the refractive indices of the material of the package structure 120 and air. In the embodiment, the refractive index of the material of the package structure 120 may range between 1.1 and 1.7. Correspondingly, the included angle θ may range between 36 degrees and 65 degrees. Accordingly, the light beams of the light emitting device 110 may exhibit a favorable asymmetric light shape after being emitted out of the package structure 120. In addition to reflecting some of the light beams (e.g., the light beam LB1) from the light emitting device 110 through the reflective particles 132 of the optical pattern 130, the refractive index of the package structure 120 may also be optionally set to be greater than the refractive index of the transparent base material 131 of the optical pattern 130. In this way, some other light beams (e.g., the light beam LB2) may undergo total reflection at the interface between the package structure 120 and the optical pattern 130, so as to facilitate the chance of a light beam being laterally transmitted in the package structure 120.

For example, a groove bottom surface 120s1 defining the first groove 120g1 of the package structure 120 has a cross-sectional surface (e.g., a XZ plane or a YZ plane) whose profile may exhibit an arc line segment, and the arc line segment extends from the ridge RL1 to right above the light emitting device 110. The curvature change of the arc line segment may be adjusted according to different total reflection requirements. The disclosure is not particularly limited in this regard. Meanwhile, since the transmittance of the optical pattern 130 is adjustable, the light output of the light emitting device 110 in the forward direction (e.g., Z direction) is adjustable. In addition, the dark spot phenomenon which occurs after some light beams (in the forward direction) are reflected by the optical pattern 130. For example, some light beams (e.g., a light beam LB3) transmitted from the light emitting device 110 toward the first groove 120g1 may directly pass through the optical pattern 130 without being reflected back to the package structure 120 by the reflective particles 132.

In the embodiment, the profile of the orthogonal projection of the region occupied by the first groove 120g1 on the surface 100s of the substrate 100 is circular, for example, and the center of the circle is located at the geometric center C, for example. In other words, in the embodiment, the width of the orthogonal projection of the region occupied by the first groove 120g1 on the surface 100s of the substrate 100 in the axial direction of the symmetric axis SA is a value that is two times of a distance D (e.g., 2D shown in FIG. 1A). However, the disclosure is not limited thereto. According to other embodiments, the profile of the orthogonal projection of the region occupied by the first groove on the surface 100s of the substrate 100 may also be circle-like, elliptical, or ellipse-like.

The profile of the orthogonal projection of the region occupied by the second groove 120g2 on the surface 100s of the substrate 100 is, for example, semi-circle-like, and has a width W shorter than the distance D in the axial direction of the symmetric axis SA. However, the disclosure is not limited thereto. Meanwhile, the package structure 120 further has a groove bottom surface 120s2 defining the second groove 120g2. The orthogonal projection of the groove bottom surface 120s2 on the surface 100s of the substrate 100 has a width W' in the axial direction of the symmetric axis SA and satisfies W'<D−(L/2). In the embodiment, in the package structure 120, the region surrounded by the ridge line RL2 defining the second groove 120g2 and the groove bottom surface 120s2 are not overlapped with the light emitting device in the normal direction of the surface 100s of the substrate 100. However, the disclosure is not limited thereto. In other embodiments, the light emitting device 110 may be partially overlapped with the region surrounded by the ridge RL2 defining the second groove 120g2 in the package structure 120 in the normal direction of the surface 100s of the substrate 100, but may not be overlapped with the groove bottom surface 120s2.

In the embodiment, the second groove 120g2 may have a high aspect ratio. That is, the sidewall of the second groove 120g2 is defined to be steeper in the package structure 120. Accordingly, the light beams from the light emitting device 110 may be effectively deflected to the region of the light emitting device 110 on a side opposite to the second groove 120g2, so as to increase the light output of a specific region while preventing the light beams from being transmitted to the light output region of the adjacent light emitting device 110.

In the embodiment, the package structure 120 may further optionally include a third groove 120g3, and the first groove 120g1 is connected between the second groove 120g2 and the third groove 120g3. In other words, the asymmetric groove of the embodiment may be a combination of the first groove 120g1, the second groove 120g2, and the third groove 120g3. It should be noted that the optical pattern 130 is not filled into the third groove 120g3. However, the disclosure is not limited thereto. In other embodiments, the optical pattern 130 may also be filled into a portion of the region occupied by the third groove 120g3.

Specifically, the package structure 120 further has a ridge RL3 defining the third groove 120g3. In addition, the ridge RL3 surrounds the first groove 120g1 and the second groove 120g2. The orthogonal projections of the regions occupied by the first groove 120g1 and the second groove 120g2 on the surface 100s of the substrate 100 are completely overlapped with the orthogonal projection of the region occupied by the third groove 120g3 on the surface 100s of the substrate 100. More specifically, the area of the orthogonal projection of the region occupied by the third groove 120g3 on the surface 100s of the substrate 100 is greater than the areas of the orthogonal projections of the regions occupied by the first groove 120g1 and the second groove 120g2 on the surface 100s of the substrate 100.

In order to effectively deflect the light beams transmitted to one side of the light emitting device 110 (e.g., the left side of the light emitting device 110 shown in FIG. 1B) to the other side of the light emitting device 110 in the opposite direction (e.g., the right side of the light emitting device 110 shown in FIG. 1B), it is defined in the package structure 120 the distance between the groove bottom surface 120s1 defining the first groove 120g1 and a top surface 110t of the light emitting device 110 needs to be greater than 0 to ensure the reflective effect of the portion of the optical pattern 130 in the second groove 120g2. It should be understood that the distance between the groove bottom surface 120s1 and the top surface 110t of the light emitting device 110 may be adjusted based on the actual light shape needs.

Meanwhile, in the normal direction of the surface 100s of the substrate 100, the distance between the ridge RL3 and the surface 100s of the substrate 100 defines a maximum thickness T of the package structure 120. A distance d is set between the groove bottom surface 120s2 and the ridge RL3, and the distance d is shorter than the maximum thickness T of the package structure 120. In other words, a gap may be provided between the groove bottom surface 120s2 and the surface 100s of the substrate 100, and the gap may allow some of the light beams to pass through to ensure the light output uniformity of the other side. However, the disclosure is not limited thereto. Based on other embodiments, the distance d between the groove bottom surface 120s2 and the ridge RL3 may also be optionally equal to the maximum thickness T of the package structure 120. In other words, the first groove 120g1, the second groove 120g2, and the third groove 120g3 connected to each other may also penetrate through the package structure 120, and the optical pattern 130 may directly cover the surface 100s of the substrate 100.

In the axial direction of the symmetric axis SA, the slope change of a surface 120as of the package structure 120 on one side of the asymmetric groove is different from the slope change of a surface 120bs of the package structure 120 on the other side of the asymmetric groove. For example, the slope of the surface 120as of the package structure 120 on one side of the light emitting device 110 gradually increases from the ridge RL3 toward the first edge 120e1 at a first changing rate, and the slope of the surface 120bs of the package structure 120 on the other side of the light emitting device 110 gradually changes from the ridge RL3 toward the second edge 120*e*2 at a second changing rate. In addition, the second changing rate is lower than the first changing rate. Since the light emitting device 110 is disposed at a position close to the first edge 120*e*1, the surface 120*bs* with a mild slope is able to increase the chance of laterally transmitting the light beams in the package structure 120 and help increase the light output uniformity of the light emitting device 110 toward a specific side.

Referring to FIG. 3A, with the arrangement of the package structure 120 and the optical pattern 130, the output light shape of the light emitting device 110 exhibits asymmetry in X direction (i.e., the axial direction of the symmetric axis SA of the package structure 120), while exhibiting symmetry in Y direction. As shown in the illuminance distribution curve on the right side of FIG. 3A, the majority of the light output of the light emitting device 110 on the XZ plane concentrates on a specific side (e.g., the lower side with respect to the horizontal broken line shown in FIG. 3A). Comparatively, as shown in the illuminance distribution curve on the lower side of FIG. 3A, the light output of the light emitting device 110 on the YZ plane is evenly distributed on two opposite sides of the light emitting device 110 (e.g., the left and right sides with respect to the vertical broken line in FIG. 3A).

Referring to FIG. 1B again, the light source module 10 of the embodiment may further include an optical film 200 disposed to be overlapped with the light emitting devices 110 and the package structures 120. The optical film 200 may be a prism sheet, a diffuser, a combination of a plurality of layers of the aforementioned, or other optical films suitable for facilitating uniformity. However, the disclosure is not limited thereto. In other embodiments, the optical film 200 may also be a wavelength conversion film, and the wavelength conversion film includes, for example, a quantum dot film, a phosphor film, etc. For example, in the embodiment, the optical film 200 has a prism sheet having a plurality of prism structures (not shown), for example. In addition, the prism structures may serve to deflect the light beams from the package structure 120 to a predetermined view angle (e.g., positive view angle) range, so as to increase the light output of the light source module 10 in the view angle range. As shown in FIG. 3B, under the acting of the optical film 200, the output light shape of the light emitting device 110 is at least symmetric in two axial directions (e.g., X and Y directions). More specifically, the light source module 10 of the embodiment may serve as a backlight module with a high light collecting property.

Some other embodiments will be provided in the following to describe the disclosure in greater detail. In the following, the same components shall be labeled with the same reference symbols, and descriptions with the same technical contents will be omitted. For the omitted part, reference is made to the contents described above and will not be repeated in the following.

Figure 4:
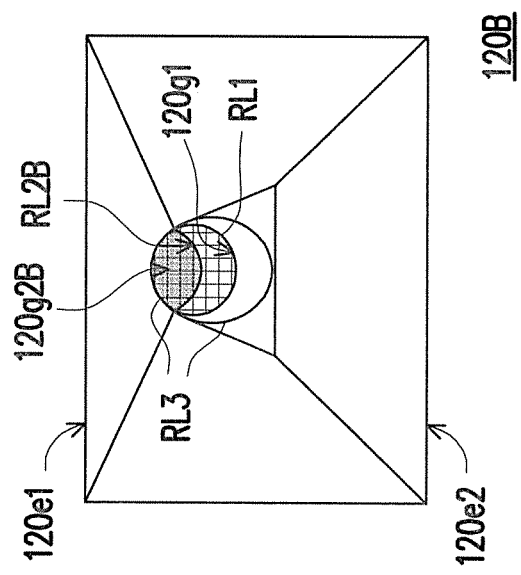
FIG. 4 is a schematic top view illustrating a package structure according to another embodiment of the disclosure.
Figure 5:
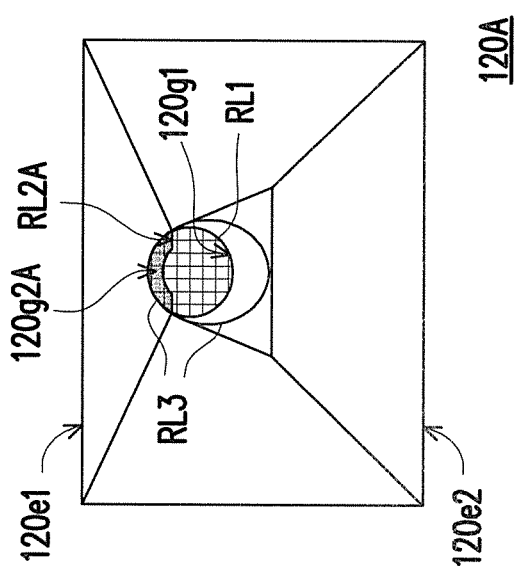
FIG. 5 is a schematic top view illustrating a package structure according to yet another embodiment of the disclosure.

FIG. 4 is a schematic top view illustrating a package structure according to another embodiment of the disclosure. FIG. 5 is a schematic top view illustrating a package structure according to yet another embodiment of the disclosure. Referring to FIG. 4, a package structure 120A of the embodiment differs from the package structure 120 of FIG. 1A in that the second groove has a different configuration. Specifically, the profile of the orthogonal projection of the region occupied by a second groove 120*g*2A of the package structure 120A on the surface 100*s* (as shown in FIG. 1B) of the substrate 100 is meniscus-like. Specifically, in the package structure 120A, a portion of a ridge RL2A defining the second groove 120*g*2A is curved toward the first edge 120*e*1 of the package structure 120A.

Nevertheless, the disclosure is not limited thereto. In yet another embodiment shown in FIG. 5, a ridge RL2B defining a second groove 120*g*2B of a package structure 120B may be entirely curved toward the second edge 120*e*2 of the package structure 120B. In other words, the profile of the orthogonal projection of the second groove 120*g*2B of FIG. 5 on the surface 100*s* (as shown in FIG. 1B) of the substrate 100 may also be rugby ball-like.

Since the configuration relationship of the package structure 120A shown in FIG. 4 (or the package structure 120B shown in FIG. 5), the optical pattern, and the light emitting device is similar to that in the light source module 10 of FIGS. 1A and 1B, reference is made to the preceding paragraphs for details in this regard, and the same contents will not be repeated in the following.

Figure 6:
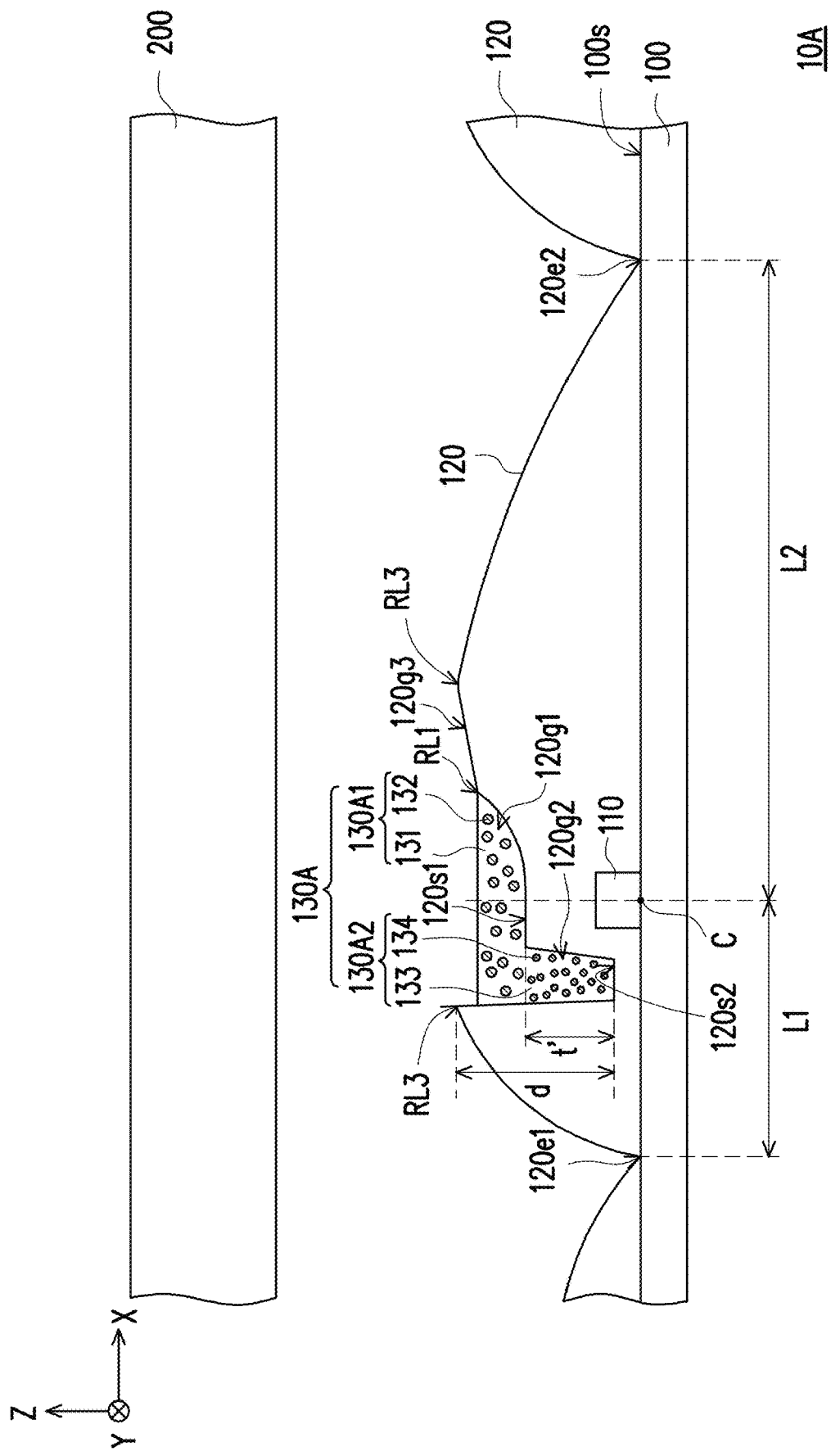
FIG. 6 is a schematic cross-sectional view illustrating a light source module according to a second embodiment of the disclosure.

FIG. 6 is a schematic cross-sectional view illustrating a light source module according to a second embodiment of the disclosure. Referring to FIG. 6, a light source module 10A of the embodiment differs from the light source module 10 of FIG. 1B in that the composition of the optical pattern is different. Specifically, an optical pattern 130A of the light source module 10A includes a first portion 130A1 and a second portion 130A2. The second portion 130A2 is disposed between the first portion 130A1 and the substrate 100. It should be noted that the first portion 130A1 of the optical pattern 130A is provided with the transmissive base material 131 and the reflective particles 132 dispersedly distributed in the transmissive base material 131, whereas the second portion 103A2 is provided with a transmissive base material 133 and a plurality of wavelength conversion particles 134 dispersedly distributed in the transmissive base material 133.

In the embodiment, the materials of the transmissive base material 131 of the first portion 130A and the transmissive base material 133 of the second portion 130A2 may be optionally the same. However, the disclosure is not limited thereto. Since the function of the reflective particles 132 of the first portion 130A1 is similar to that of the reflective particles 132 of FIG. 1B, reference is made to the preceding paragraphs for details in this regard, and the same contents will not be repeated in the following.

For example, the wavelength conversion particles 134 of the second portion 130A2 of the optical pattern 130A may have a single particle size or multiple particle sizes to satisfy different light mixing needs. In the embodiment, the first portion 130A1 and the second portion 130A2 of the optical pattern 130A are respectively disposed in the first groove 120*g*1 and the second groove 120*g*2 of the package structure 120. The second portion 130A2 has a thickness t' in the normal direction of the surface 100*s* of the substrate and satisfies t'<2d/3, wherein d represents a distance between the groove bottom surface 120*s*2 and the ridge RL3 in the normal direction of the surface 100*s* of the substrate 100. Accordingly, the light mixing effect of the light beams emitted from the package structure 120 is optimized.

However, the disclosure is not limited thereto. In other embodiments, the first portion 130A1 of the optical pattern 130A may be further filled into the second groove 120*g*2 of the package structure 120, or the second portion 130A2 may be further filled into the first groove 120*g*1 of the package structure 120. In other words, the disclosure is not limited to the contents disclosed in FIG. 6 (i.e., the interface between the first portion 130A1 and the second portion 130A2 of the optical pattern 130A is aligned to the groove bottom surface 120*s*1 of the package structure 120).

In view of the foregoing, in the light source module according to an embodiment of the disclosure, the light emitting device is disposed to be overlapped with the geometric center of the first groove of the package structure, and the optical pattern is filled into the first groove. With the optical pattern being transflective, the forward light output of the light emitting device may be adjusted, and the dark spot phenomenon which occurs after some of the light beams are reflected by the optical pattern may be alleviated. Meanwhile, the second groove connected with the first groove is disposed on a side of the light emitting device, and the optical pattern further extends into the second groove. Accordingly, the majority of the light beams may be deflected to a region of the light emitting device on a side opposite to the second groove. Thus, the light output of a specific region may be effectively increased, while the light beams may be prevented from being transmitted to the light output region of the adjacent light emitting device.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light source module, comprising:
   a substrate;
   a light emitting device, disposed on a surface of the substrate;
   a package structure, disposed on the surface of the substrate and covering the light emitting device, wherein the package structure has a first groove and a second groove connected to each other, the light emitting device is located between the first groove and the substrate, the second groove is located between the first groove and the substrate, an orthogonal projection of a region occupied by the first groove on the substrate has a geometric center, the light emitting device is located at the geometric center, an orthogonal projection of a region occupied by the second groove on the substrate is not overlapped with the geometric center, and an orthogonal projection of the region occupied by the first groove and the second groove on the substrate completely overlaps a orthogonal projection of the package structure on the substrate; and
   an optical pattern, disposed in the first groove and the second groove and being transflective, wherein the package structure surrounds the optical pattern.

2. The light source module as claimed in claim 1, wherein an orthogonal projection of the package structure on the substrate has a symmetric axis, the symmetric axis passes through the geometric center, and the second groove and the light emitting device are arranged along an axial direction of the symmetric axis.

3. The light source module as claimed in claim 2, wherein the package structure is further provided with a first edge and a second edge opposite to each other, wherein a first distance is provided between the first edge and the geometric center, a second distance is provided between the second edge and the geometric center, and the first distance is shorter than the second distance.

4. The light source module as claimed in claim 3, wherein a ratio of the first distance to the second distance is less than 0.8.

5. The light source module as claimed in claim 2, wherein the package structure further has a ridge defining the first groove, a distance D is provided between the ridge and the geometric center in the axial direction of the symmetric axis, the region occupied by the second groove has a width W in the axial direction of the symmetric axis, and W<D is satisfied.

6. The light source module as claimed in claim 5, wherein the light emitting device has a device length L in the axial direction of the symmetric axis, the package structure further has a groove bottom surface defining the second groove, the groove bottom surface has a width W' in the axial direction of the symmetric axis, and W'<D−(L/2) is satisfied.

7. The light source module as claimed in claim 6, wherein the package structure and the light emitting device respectively have a maximum thickness T and a device thickness t in a normal direction of the surface of the substrate, an included angle $\theta$ is provided between a virtual connection line, as a shortest interval between the ridge and the light emitting device, and the normal direction of the surface of the substrate, and $D = L/2 + (T−t) \cdot \tan \theta$ is satisfied.

8. The light source module as claimed in claim 1, wherein the package structure further has a groove bottom surface defining the first groove, the light emitting device has a top surface facing the first groove, and a distance between the groove bottom surface of the package structure and the top surface of the light emitting device is greater than zero.

9. The light source module as claimed in claim 1, wherein the package structure further has a ridge surrounding the first groove and the second groove and a groove bottom surface defining the second groove, a distance between the ridge and the surface of the substrate defines a maximum thickness of the package structure in a direction perpendicular to the substrate, a distance is provided between the groove bottom surface and the ridge in the direction perpendicular to the substrate, and the distance is shorter than the maximum thickness of the package structure.

10. The light source module as claimed in claim 1, wherein the optical pattern comprises a first portion and a second portion, the second portion is disposed between the first portion and the substrate, the first portion has a plurality of reflective particles, and the second portion has a plurality of wavelength conversion particles.

11. The light source module as claimed in claim 10, wherein the package structure further has a ridge surrounding the first groove and the second groove and a groove bottom surface defining the second groove, the first portion of the optical pattern contacts the groove bottom surface, a distance d is provided between the groove bottom surface and the ridge in a direction perpendicular to the substrate, and the second portion has a thickness t' in the direction perpendicular to the substrate, and t'<2d/3 is satisfied.

12. The light source module as claimed in claim 1, wherein a transmittance of the optical pattern ranges between 10% and 50%.

13. The light source module as claimed in claim 1, wherein the optical pattern comprises:
    a transmissive base material; and
    a plurality of reflective particles, dispersedly distributed in the transmissive base material.

14. The light source module as claimed in claim 13, wherein a material of the reflective particles comprises silicon dioxide, titanium dioxide, a metal material, or a combination thereof.

* * * * *